United States Patent [19]
Dijkmans et al.

[11] 4,415,815
[45] Nov. 15, 1983

[54] ELECTRONIC SWITCH

[75] Inventors: Eise C. Dijkmans; Rudy J. Van de Plassche, both of Eindhoven, Netherlands

[73] Assignee: U.S. Philips Corporation, New York, N.Y.

[21] Appl. No.: 351,573

[22] Filed: Feb. 23, 1982

Related U.S. Application Data

[63] Continuation of Ser. No. 135,967, Mar. 31, 1980, abandoned.

[30] Foreign Application Priority Data

Apr. 4, 1979 [NL] Netherlands .......................... 7902633

[51] Int. Cl.³ ............................................. H03K 17/60
[52] U.S. Cl. .................................... 307/243; 307/254; 307/259
[58] Field of Search ........................ 307/243, 259, 254

[56] References Cited

U.S. PATENT DOCUMENTS

| | | | |
|---|---|---|---|
| 3,141,136 | 7/1964 | Pagano | 307/259 |
| 3,334,249 | 8/1967 | White | 307/259 |
| 4,223,235 | 9/1980 | Rufray | 307/243 |
| 4,256,980 | 3/1981 | Asada | 307/254 |

*Primary Examiner*—Harold A. Dixon
*Attorney, Agent, or Firm*—Robert T. Mayer; Bernard Franzblau

[57] ABSTRACT

An electronic switch having an input and an output. Between the input and output a semiconductor junction is included which is switched by a transistor whose emitter electrode is connected to a terminal of the semiconductor junction which faces the input and whose base electrode is connected to a switching input. To reduce switching delays caused by stray capacitances on the inputs, a resistor is included between the connecting point of the emitter of the transistor and the semiconductor junction and the input, and the input is connected to a current source which is switched in synchronism with the transistor to provide a current such that the voltage swing produced across said resistor by said switched current source compensates for the voltage swing appearing on the emitter of the transistor during switching.

7 Claims, 4 Drawing Figures

ELECTRONIC SWITCH

This is a continuation of application Ser. No. 135,967, filed Mar. 31, 1980 now abandoned.

The invention relates to an electronic switch comprising a signal input, a signal output and a switching input. A first transistor is provided having an emitter electrode connected to the signal input, a base electrode coupled to the switching input for optionally turning on or turning off the first transistor, and a collector electrode connected to a current sink. A switching element comprising a rectifying semiconductor junction is included between the signal input and the signal output for conducting a current applied to the signal input when the first transistor is cut off. The switching element is coupled to a point of constant potential so that, during conduction of said switching element as a result of the first transistor being turned off, the emitter electrode of the first transistor carries a predetermined first potential. During non-conduction of said switching element as a result of the first transistor being turned on, the emitter electrode of the first transistor carries a predetermined second potential.

Such switches are employed inter alia in digital-analog converters, in order to switch to an output, depending on the digital signal, a selected number of currents of a plurality of currents which are proportioned in accordance with a binary progression (for this see, inter alia, Electronic Products, Dec. 18, 1972, pages 57–63, in particular FIG. 4). The minimum urrent to be switched relative to the maximum current to be switched is then determined by the number of bits of the digital signal and thus by the maximum of the analog signal. At, for example, a maximum output current of 4 mA the minimum current is approximately 250 Na for a 14-bit D/A converter. This means that stringent requirements are imposed on the accuracy of the electronic switch. A suitable type of switch is the type mentioned in the preamble, said switching element being preferably a diode, in which said coupling to the point of constant potential can be realized by connecting the signal output to the input of a negatively fed back operational amplifier, which input constitutes a virtual ground point.

However, in some D/A converters, for example, said switch is not always fast enough. We have discovered that this is due to the fact that in order to turn said switching element on and off, specifically a diode, a voltage swing is required at the emitter electrode of the first transistor and thus at the signal input. Connected to the signal input is an input current source which exhibits a stray capacitance, in most cases a collector capacitance of a transistor which is included in the current source or which is connected in series therewith. This stray capacitance should follow said voltage swing and for this purpose it is discharged from the input current source when the switching element is turned off. Such a stray capacitance may for example be 3 pF, while the voltage swing as a result of switching may for example be 400 mV. If the signal current is small, for example 250 nA as mentioned previously, this charging takes a comparatively long time because at the most the charging current is equal to the signal current and the turn-on time is thus at least equal to $C\Delta V/I_s$, where C is said stray capacitance value, V the voltage swing and $I_s$ the signal current intensity. In the said numerical example this minimum turn-on time is therefore 5 $\mu$secs., which is far too long in many applications.

It is an object of the invention to provide an electronic switch of the type mentioned in the preamble which does not have said disadvantage and to this end the invention is characterized in that a first resistor is included between the signal input and the connecting point of the emitter electrode of the first transistor and the switching element, that the signal input is connected to a current source which is switched in synchronism with the first transistor, which current source during conduction of the first transistor supplies an additional current, which flows via the first resistor and the first transistor, to the signal input, which current has such an intensity that the voltage drop produced across the first resistor by said current substantially compensates for the difference between said first and second potentials.

The step in accordance with the invention ensures that the said voltage swing does not appear on the signal input so that the said problem is solved.

In order to ensure a satisfactory synchronism of the switched current source and the switching of the first transistor the invention may be further characterized in that the switched current source comprises a second and a third transistor having emitter electrodes jointly connected to a current source and that the collector electrode of the second transistor is connected to the signal input and the collector electrode of the third transistor to the base electrode of the first transistor, which base electrode is connected via a second resistor to a point at a potential level such that the first transistor is conductive during non-conduction of the third transistor and is non-conductive during conduction of said third transistor.

The invention will be described in more detail with reference to the drawing, in which.

Figure 1:
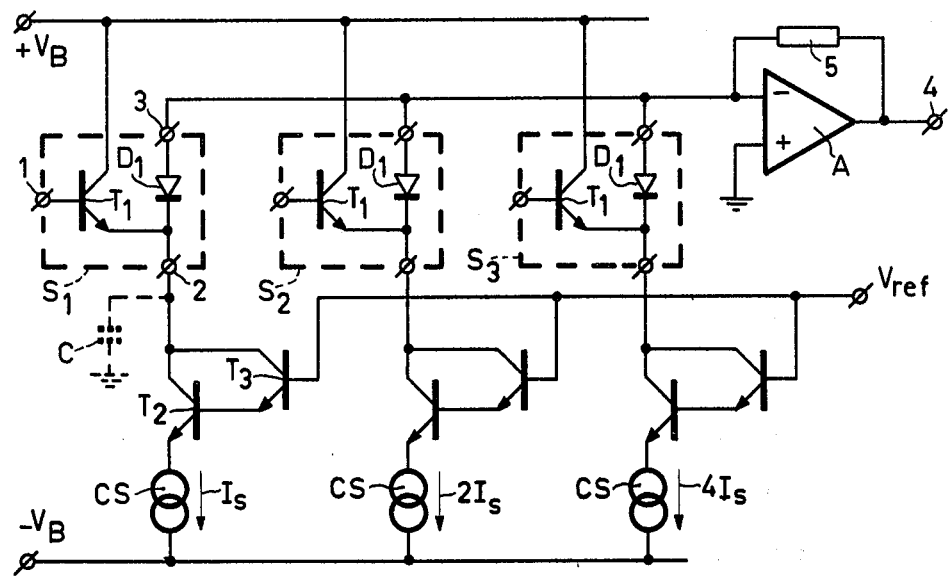
FIG. 1 shows a known analog-digital converter with electronic switches.

FIG. 1 shows an example of the use of an electronic switch S in a digital-analog converter. It comprises a plurality of accurate current sources CS which carry currents whose amplitudes are in a mutual proportion in accordance with the progression $1:2:4:\ldots 2^n$, of which for the sake of simplicity FIG. 1 shows three sources with the current amplitudes $I_s$, $2I_s$ and $4I_s$. If, for example, a 14-bit A-D converter is desired, 14 current sources are required. Via an electronic switch ($S_1$, $S_2$ and $S_3$) each current source is connected to a summing circuit comprising an operational amplifier A which provides negative feedback between an output (4) and an inverting input (−) via a resistor 5 having a value R1. The non-inverting input (+) of said amplifier is connected to ground. Thus, the inverting input (−) carries a direct voltage equal to zero volts and the output voltage is equal to $R_1 \cdot (K_1 + 2K_2 + 4K_3 \ldots nK_n) I_s$, where $K_1, K_2 \ldots K_n$ equals 1 or 0 depending on whether switches $S_1, S_2, S_3 \ldots S_n$ respectively are closed or not.

Between the input current source CS and the associated switch S a Darlington arrangement made up of transistors $T_2$ and $T_3$ is included to provide isolation between the switch S and the current source CS. The Darlington arrangement is of little further significance for an understanding of the operation of the circuit.

Each of the electronic switches $S_1$ to $S_n$ comprises a transistor $T_1$ having an emitter connected to a signal input 2, which via Darlington arrangement $T_2$, $T_3$ is connected to the associated signal current source CS. The collector of $T_1$ is connected to a power supply terminal $+V_B$ and the base is connected to a switching input 1. Via a diode $D_1$ the signal input 2 is connected to a signal output 3, which is connected to the inverting input (−) of operational amplifier A.

If the switching voltage at switching input 1 is sufficiently high, diode $D_1$ is cut off and the signal current $I_s$ flows to the positive power supply terminal $+V_B$ via transistor $T_1$. If the switching voltage at switching input 1 is sufficiently low, transistor $T_1$ is cut off and diode $D_1$ transfers the signal current $I_s$ to operational amplifier A. Thus, diode $D_1$ in fact functions as a switch and is controlled by transistor $T_1$. Especially for very small signal currents $I_s$, which may occur in particular in very accurate digital-analog converters, it was found that the electronic switch S used in the circuit of FIG. 1 did not perform satisfactorily because the switching speed appears to be too low. This is caused by the stray capacitance C present at signal input 2, which in the present example is mainly constituted by the collector capacitances of the transistors $T_2$ and $T_3$, but which in the absence of the Darlington arrangement $T_2$ and $T_3$ is constituted by the output capacitance of the signal current source CS.

Figure 2:
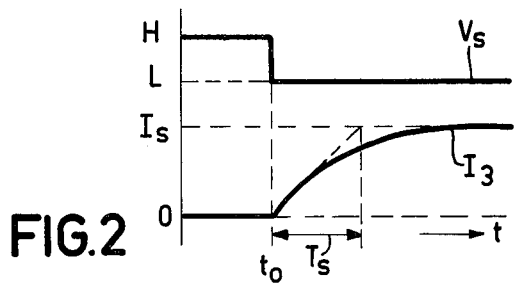
FIG. 2 represents the switching response of the electronic switches employed in the circuit of FIG. 1.

FIG. 2 represents the time relationship between the switching voltage $V_S$ at switching input 1 of the switch $S_1$ and the current $I_3$ at output 3 of the switch $S_1$. If at instant $t_o$ the voltage $V_S$ at switching input 1 is reduced from level H to level L, transistor $T_1$ is cut off. In order to allow diode $D_1$ to be turned on, the voltage on signal input 2 should then decrease, which is possible only by discharging the stray capacitance C. The stray capacitance is discharged with a current $I_s$ by current source CS as long as diode $D_1$ is not yet conductive. The most favourable situation is then that in which voltage level H is chosen so that during conduction of transistor $T_1$ the voltage at signal input 2 is exactly such that diode $D_1$ just does not conduct. In that case the voltage swing at input 2 is minimal upon changing over. The switching time $T_s$ can simply be calculated by assuming that during change-over the capacitance C is discharged by the full current $I_s$, which in reality is not the case because as diode $D_1$ becomes more conductive an increasing portion of the current $I_3$ flows through diode $D_1$. For this switching time $T_s$ thus defined, the relationship $T_s = C_s \Delta V / I_s$ is valid, where $C_s$ is the capacitance value of the stray capacitance C and $\Delta V$ the voltage swing at input 2. In practice $\Delta V$ may have a value of 400 mV, $I_s$ a value equal to 250 nA and $C_s$ a value of 3 pF, which yields a value of 4.8 microseconds for the switching time $T_s$, which is too long for fast D-A converters.

Figure 3:
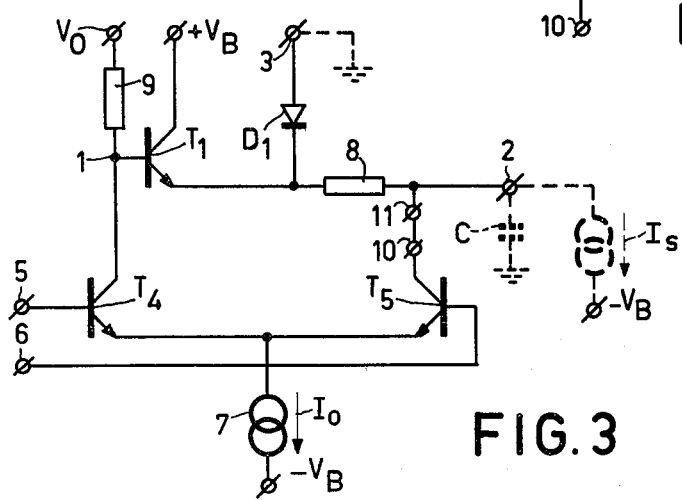
FIG. 3 shows an improved electronic switch in accordance with the invention.

FIG. 3 shows a switch S in accordance with the invention. Similarly to the switch S in FIG. 1 it comprises the transistor $T_1$, the switching diode $D_1$, a signal input 2 and a signal output 3. In accordance with the invention a resistor 8 is included between signal input 2 and the connecting point of the emitter of transistor $T_1$ and diode $D_1$.

In accordance with the invention a current $I_o$ should be passed through resistor 8 at the same time that transistor $T_1$ is turned on, which current has such a value that the voltage at signal input 2 substantially does not change. In order to ensure that the current $I_o$ is passed through the resistor 8 of the resistance value $R_2$ at the same time that transistor $T_1$ is turned on, the circuit arrangement of FIG. 3 includes a differential pair composed of the transistors $T_4$ and $T_5$ having a common emitter connection connected to the current source 7, which carries a current $I_o$. The base electrodes of transistors $T_4$ and $T_5$ lead to a switching input (5 and 6). The collector of transistor $T_5$ is connected to signal input 2 and the collector of transistor $T_4$ to the base of transistor $T_1$, which via a resistor 9 of the value $R_3$ is connected to a point of reference voltage $V_o$.

If the voltage at the base of transistor $T_4$ is high relative to the base of transistor $T_5$, the current $I_o$ flows to $V_o$ via transistor $T_4$ and resistor 9 and transistor $T_1$ is cut off in the case of a correct dimensioning of resistor 9, the current $I_o$ and the voltage $V_o$, so that the signal current $I_s$ will flow via diode $D_1$. If the voltage at the base of transistor $T_4$ is sufficiently low relative to the voltage at the base of transistor $T_5$, no current will flow through resistor 9 to the transistor $T_4$, but a base current will flow to transistor $T_1$ and transistor $T_1$ will conduct at a correct value of the voltage $V_o$. The current $I_o$ then flows through transistor $T_5$, resistor 8 and transistor $T_1$, whereas the signal current $I_s$ flows through resistor 8 and transistor $T_1$. If resistor 9 has the correct value $R_3$, the voltage at input 2 will be independent of the switching state of transistor $T_1$ and the signal current $I_s$ will flow to signal output 3 via diode $D_1$ almost immediately after transistor $T_1$ is turned off, because in the absence of a voltage swing at signal input 2 the stray capacitance C at the input is not charged or discharged. In this respect it is to be noted that any stray capacitance on the collector of transistor $T_4$ hardly affects the switching speed because said capacitance can be discharged sufficiently fast if the current $I_o$ is selected sufficiently large.

The following rules may be given for the dimensioning of the resistors 8 and 9, the current $I_o$ and the voltage $V_o$:

The voltage at input 2 should remain constant, which yields the equation:

$$V_o = V_{be} - V_d + I_o R_2 \tag{1}$$

where $V_{be}$ is the voltage across the base-emitter junction of transistor $T_1$ during conduction of the current $I_o + I_s$ and $V_d$ the voltage across diode $D_1$ during conduction of the current $I_s$. Furthermore, the voltage $V_o$ should be sufficiently high in order to ensure that transistor $T_1$ conducts and diode $D_1$ is cut off when transistor $T_5$ conducts, which leads to the requirement:

$$V_o \geq V_{be} \tag{2}$$

When transistor $T_4$ conducts transistor $T_1$ should be cut off and diode $D_1$ should conduct, which results in the requirement:

$$V_o \leq I_o R_3 - V_d \tag{3}$$

Said requirements are for example met if:

$$V_o = V_{be}$$

$$I_o R_2 = V_d$$

$$I_o R_3 \geq V_{be} + V_d$$

In the foregoing consideration it has been assumed that diode $D_1$ is cut off if the voltage $V_d$ across diode $D_1$ is zero volts and also that the base-emitter voltage $V_{be}$ should be zero volts to obtain conduction of transistor $T_1$. This results in a minimum value for $V_o$ equal to the base-emitter voltage $V_{be}$ and a minimum voltage swing equal to $V_{be} + V_d$ across resistor 9. In practice the voltage $V_o$ and the voltage swing $I_o R_3$ may be reduced substantially if in the cut-off state of transistor $T_1$ or diode $D_1$ a certain residual current is allowed to flow through transistor $T_1$ or diode $D_1$. In general it will be possible to replace diode $D_1$ between input 2 and output 3 by the main current path of a transistor having a control electrode connected to a point of constant potential so that the signal current $I_s$ is then available at a high-ohmic output 3. In the present embodiment a diode may be used because output 3 is connected to virtual ground (inverting input of an operational amplifier), which is to be preferred because if a bi-polar transistor were used instead of diode $D_1$ the base current of said transistor would cause an inequality between the current at input 2 and output 3.

If, for the current measurement, instead of using an operational amplifier A, a resistor was connected between diode $D_1$ and a point of constant potential then the voltage variation across the resistor caused by the switched signal current $I_s$, which variation appears at input 2, may be compensated by a suitable choice of the resistor 8.

Figure 4:
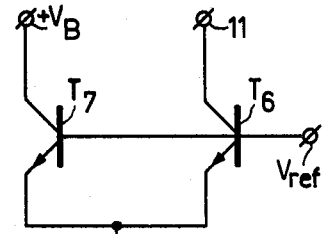
FIG. 4 shows a circuit which may be included between points 10 and 11 in the collector circuit of transistor T5 in the circuit of FIG. 3 in order to improve the switching speed.

The switching speed of the circuit of FIG. 3 is further limited because switching the current $I_o$ from transistor $T_4$ to transistor $T_5$ immediately results in a swing at point 2 via the collector of transistor $T_5$, while a delayed swing appears at point 2 from transistor $T_4$ in a compensating sense via the base diffusion capacitance of transistor $T_1$ and resistor 8. This problem can be solved by including an additional transistor $T_6$ in the collector circuit of transistor $T_5$ between points 10 and 11. As the base diffusion capacitance of transistor $T_1$ depends on the emitter current, said capacitance can be reduced by reducing the collector current of transistor $T_5$. However, because of the switching speed the current $I_s$ may not be reduced. A solution is to replace said transistor $T_6$ by a current divider. This current divider, which may be included between points 10 and 11 in the circuit of FIG. 3, is shown in FIG. 4. The collector of transistor $T_7$ is then connected to the supply voltage and the bases of transistors $T_6$ and $T_7$ are connected to a point at reference voltage $V_{ref}$ (for example, point $V_{ref}$ in the circuit of FIG. 1). If this step is adopted the dimensioning of resistor 8 discussed in the foregoing should be increased by a factor which is the inverse of the current dividing factor of transistors $T_6$ and $T_7$.

What is claimed is:

1. An electronic switch comprising a signal input, a signal output and a switching input, a first transistor having an emitter electrode connected to the signal input, a base electrode coupled to the switching input for selectively turning the first transistor on and off, and a collector electrode connected to a current sink, a switching element comprising a rectifying semiconductor junction connected between the signal input and the signal output for conducting a current applied to the signal input when the first transistor is cut off, means coupling the switching element to a point of constant potential so that, during conduction of said switching element in response to turn-off of the first transistor, a first predetermined potential appears at the emitter electrode of the first transistor, whereas during non-conduction of said switching element in response to turn-on of the first transistor, a second predetermined potential appears at the emitter electrode of the first transistor, means connecting a first resistor between the signal input and a connecting point of the emitter electrode of the first transistor and the switching element, means connecting the signal input to a current source switched in synchronism with the first transistor so that the source supplies an additional current during conduction of the first transistor wich flows via the first resistor and the first transistor to the signal input, said current producing a voltage drop across the first resistor that substantially compensates for the difference between said first and second potentials.

2. An electronic switch as claimed in claim 1 wherein the switched current source comprises a second and a third transistor having emitter electrodes jointly connected to a current source and base electrodes that constitute said switching input, the collector electrode of the second transistor being connected to the signal input and the collector electrode of the third transistor to the base electrode of the first transistor, and means connecting the base electrode of the first transistor via a second resistor to a point at a potential level such that the first transistor conducts during non-conduction of the third transistor and is cut-off during conduction of said third transistor.

3. An electronic switch as claimed in claim 2 further comprising a fourth transistor having a main current path connected between the collector of the second transistor and the signal input, the emitter electrode of the fourth transistor being connected to the collector electrode of the second transistor and the base electrode thereof being connected to a point of reference voltage.

4. An electronic switch as claimed in claim 3 further comprising a fifth transistor connected to the fourth transistor to form a current dividing circuit with the emitter and the base electrodes of said fifth transistor connected to the emitter and the base electrode of the fourth transistor, respectively.

5. An electronic switch comprising a first transistor having emitter, base and collector electrodes, a signal input terminal for coupling to a source of current, a signal output terminal, a resistor, a switching element including a semiconductor rectifying junction coupled to a point of constant voltage, means connecting the switching element between the signal input and output terminals via said resistor to couple said source of current to the signal output terminal when the switching element is on, means connecting the emitter of the first transistor to a common connecting point between the switching element and the resistor and the collector thereof to a source of electric supply, a switching input coupled to the first transistor base electrode for selectively turning the first transistor on and off to produce a voltage variation at the emitter thereof, said switching element being turned on and off when said first transistor is turned off and on, respectively, and means coupling the signal input terminal to a current source that is switched in synchronism with the first transistor so that a current flows through the first transistor and the resistor during conduction of the first transistor of a value to produce a voltage drop across the resistor that compensates for the voltage variation at said first transistor emitter electrode.

6. An electronic switch as claimed in claim 5 wherein the switched current source comprises second and third transistors having emitter electrodes connected together to a current source and base electrodes coupled to the switching input, the collector of the second transistor being connected to the signal input, the collector of the third transistor being connected to the base of the first transistor to apply a switching signal thereto, and a second resistor coupling the base of the first transistor to a source of reference voltage such that the first transistor is conductive during non-conduction of the third transistor and vice versa.

7. An electronic switch as claimed in claim 5 wherein the switched current source includes a second transistor for selectively coupling a second current source to the signal input when said switching element is turned off thereby to provide a current flow in said resistor of a value to maintain the voltage level at the signal input terminal substantially constant independently of the state of the switching element.

* * * * *